(12) United States Patent
Chien

(10) Patent No.: US 11,156,885 B2
(45) Date of Patent: Oct. 26, 2021

(54) DISPLAY PANEL AND METHOD OF REPAIRING THE SAME

(71) Applicants: HKC Corporation Limited, Guangdong (CN); Chongqing HKC Optoelectronics Technology Co., Ltd., Chongqing (CN)

(72) Inventor: Chung-Kuang Chien, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 63 days.

(21) Appl. No.: 16/623,184

(22) PCT Filed: Oct. 16, 2017

(86) PCT No.: PCT/CN2017/106308
§ 371 (c)(1),
(2) Date: Dec. 16, 2019

(87) PCT Pub. No.: WO2018/233154
PCT Pub. Date: Dec. 27, 2018

(65) Prior Publication Data
US 2020/0117065 A1 Apr. 16, 2020

(30) Foreign Application Priority Data
Jun. 20, 2017 (CN) .......................... 201710470233.1

(51) Int. Cl.
*G02F 1/1368* (2006.01)
*G02F 1/1362* (2006.01)
(Continued)

(52) U.S. Cl.
CPC ...... *G02F 1/136259* (2013.01); *G02F 1/1368* (2013.01); *G02F 1/133514* (2013.01);
(Continued)

(58) Field of Classification Search
None
See application file for complete search history.

(56) References Cited

U.S. PATENT DOCUMENTS

| 2007/0114918 | A1* | 5/2007 | Arai | G09G 3/006 |
| | | | | 313/504 |
| 2008/0316406 | A1* | 12/2008 | Inoue | G02F 1/1337 |
| | | | | 349/123 |
| 2012/0300165 | A1* | 11/2012 | Zhuang | G09G 3/3648 |
| | | | | 349/139 |

FOREIGN PATENT DOCUMENTS

| CN | 101408681 A | 4/2009 |
| CN | 101788739 A | 7/2010 |

(Continued)

*Primary Examiner* — James A Dudek
(74) *Attorney, Agent, or Firm* — Muncy, Geissler, Olds & Lowe, P.C.

(57) ABSTRACT

A display panel comprises a first substrate, a second substrate, and an active switch matrix. The first substrate comprises color resistor units, and the second substrate is disposed opposite to the first substrate. The active switch matrix is disposed on the first substrate or the second substrate. The active switch matrix comprises scan lines and data lines. A first repair line is disposed on one side of at least one of the scan lines, and a second repair line is disposed on one side of at least one of the data lines.

10 Claims, 3 Drawing Sheets

(51) Int. Cl.
   *G02F 1/1335*   (2006.01)
   *H01L 21/66*    (2006.01)
   *H01L 27/12*    (2006.01)
(52) U.S. Cl.
   CPC ........ *G02F 1/136286* (2013.01); *H01L 22/22* (2013.01); *H01L 27/124* (2013.01); *G02F 1/136263* (2021.01)

(56)     References Cited

FOREIGN PATENT DOCUMENTS

| CN | 102289120 A | 12/2011 |
| CN | 202693964 U | 1/2013 |
| CN | 103135299 A | 6/2013 |

* cited by examiner

DISPLAY PANEL AND METHOD OF REPAIRING THE SAME

BACKGROUND

Technical Field

This disclosure relates to a technical field of a display panel, and more particularly to a display panel and method of repairing the same.

Related Art

As the developing and progress of technology, the display has many advantages, such as the slim body, the power-saving property, the radiationless property and the like, and has been widely used. Most of the displays in the existing market are backlight displays, which include a display panel and a backlight module. The working principle of the display panel is to refract the light rays from the backlight module to produce a frame by placing liquid crystal molecules in two parallel substrates, and by applying a driving voltage to the two substrates to control the orientations of the liquid crystal molecules.

A thin film transistor-liquid crystal display (TFT-LCD) has the low power consumption, excellent frame quality and high production yield and other performances, and has now gradually occupied the dominant position in the display field. Similarly, the TFT-LCD includes the display panel and the backlight module. The display panel includes a color filter substrate (CF substrate, also referred to as a color filter substrate), a thin film transistor substrate (TFT substrate) and a mask, and the transparent electrode is present on the opposite inner sides of the above-mentioned substrates. A layer of liquid crystal (LC) molecules is disposed between the two substrates.

As the LCD product tends to be developed in the high-resolution direction, the problem, such as the floating particles, tends to cause the problem of poor conduction of the in-cell traces. How to solve this problem is an issue to be solved by those skilled in the art.

To be noted, the above description of the technology background is provided for facilitating the following descriptions of the technical solutions of the disclosure and the easily understanding of the skilled persons in the art, and the above mentioned technical features are not necessary to be well known by those skilled persons in the art.

SUMMARY

In view of the above-mentioned defects of the existing technology, the technical problem to be solved by this disclosure is to provide a display panel that can be repaired when a scan line or a data line has the poor conduction, a display device and a repair method of the display panel.

To achieve the above objective, the present disclosure provides a display panel comprising:
a first substrate comprising color resistor units;
a second substrate disposed opposite to the first substrate; and
an active switch matrix disposed on the first substrate or the second substrate;
wherein the active switch matrix comprises scan lines and data lines;
a first repair line is disposed on one side of at least one of the scan lines, and a second repair line is disposed on one side of at least one of the data lines.

In one embodiment, the first repair lines correspond to the scan lines in a one-to-one manner, the second repair lines correspond to the data lines in a one-to-one manner.

In one embodiment, the first repair lines are disposed in correspondence with the scan lines in one layer or different layers.

In one embodiment, the second repair lines are disposed in correspondence with the data lines in one layer or different layers.

In one embodiment, the first repair lines and the second repair lines are disposed in one layer or different layers.

The present disclosure also provides a display panel comprising:
a first substrate comprising color resistor units;
a second substrate disposed opposite to the first substrate; and
an active switch matrix disposed on the first substrate or the second substrate;
wherein, the active switch matrix comprises scan lines and data lines;
a first repair line is disposed on one side of at least one of the scan lines, and a second repair line is disposed on one side of at least one of the data lines.

The present disclosure also provides a method of repairing a display panel. The display panel comprises a first substrate and a second substrate disposed opposite to the first substrate. The first substrate comprises color resistor units, and an active switch matrix is disposed on the first substrate or the second substrate. The active switch matrix comprises scan lines and data lines. The method comprises steps of:
correspondingly disposing a first repair line beside the scan line, and correspondingly disposing a second repair line beside the data line;
looking for an opened scan line or an opened data line; and
respectively bridging two ends of the opened scan line or the opened data line with the first repair line and the second repair line to form an electroconductive pathway.

In this embodiment, analysis is performed according to the found opened scan line or data line to determine whether a first repair line or a second repair line needs to be used for repair, or two repair lines are needed for repair. After the analysis, the repair lines are bridged to form an electroconductive pathway to repair the open-circuit problem.

Furthermore, the step of respectively bridging the two ends of the opened scan line or the opened data line with the first repair line and the second repair line to form the electroconductive pathway comprises: bridging the scan line or the data line with the corresponding first repair line and second repair line by way of laser bonding.

In this embodiment, the bridging is mainly achieved by bonding methods, such as a laser bonding lamp and the like. In addition, the first repair line and the second repair line adopted as the repair routes are not incorporated into portions of the electroconductive pathways, and are isolated from the portions of the electroconductive pathways by way of disconnecting to avoid the possibility of short-circuited, open-circuited and other problems.

In this disclosure, the first repair line and the second repair line are correspondingly disposed beside the scan line and the data line. In this way, not only the data line but also the scan line can be repaired. In addition, because there may be provided with two first repair lines and two second repair lines, the repair number is better enhanced in this way. Furthermore, because the lengths of the first repair line and the second repair line are equal to those of the corresponding scan line and data line, this disclosure is free from the problems that the attenuation is caused by the too-long layout and that the operation amplification is needed.

Although this disclosure has been described with reference to specific embodiments, this description is not meant to be construed in a limiting sense. Various modifications and improvements of the disclosed embodiments will be apparent to persons skilled in the art and deemed as falling within the scope of the claims. It is, therefore, contemplated that the appended claims will cover all modifications that fall within the true scope of the invention.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

The embodiments of the invention will be apparent from the following detailed description, which proceeds with reference to the accompanying drawings, wherein the same references relate to the same elements.

Figure 1:
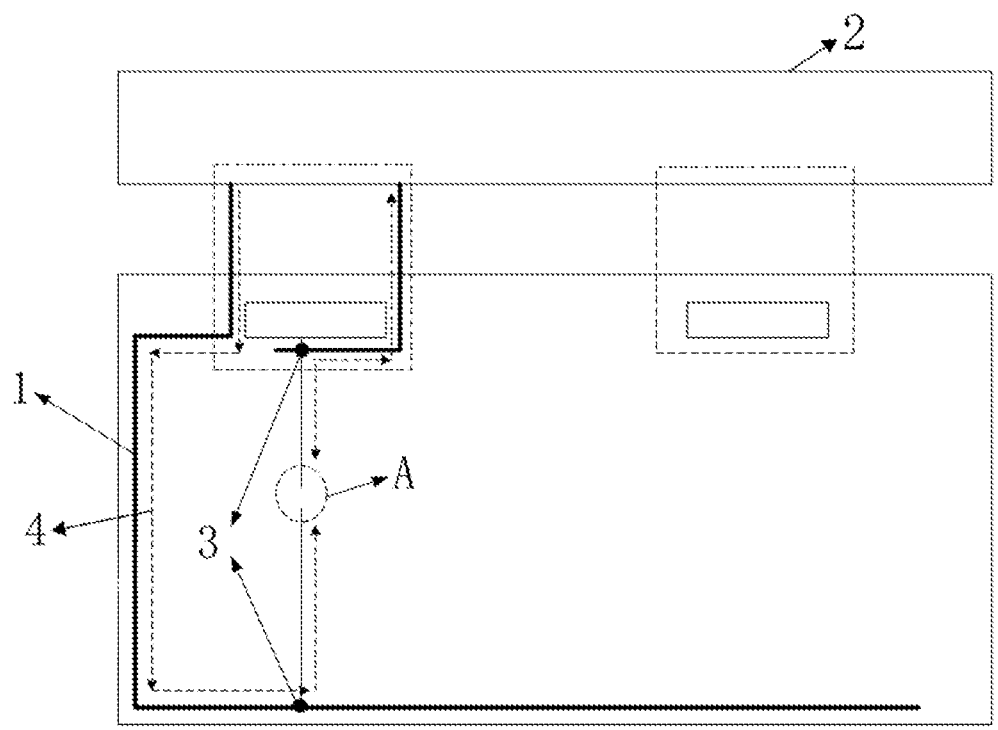
FIG. 1 is a schematic view showing a panel on which disconnection repair is needed.

FIG. 1 is a schematic view showing a panel on which disconnection repair is needed.

As the LCD product tends to be developed in the high-resolution direction, the problem, such as the floating particles, tends to cause the problem of poor conduction of the in-cell traces. The applicant has adopted the scheme for repair shown in FIG. 1.

Specifically, the design adopts a repair line 1 running along peripheral routes of the substrate to perform the repair. Referring to FIG. 1, a portion A in the figure is a disconnection position (the line is broken or opened), which can be repaired through the repair line 1, that is, the opened data line is replaced with the repair line through a bonding point 3 to complete the trace conduction. In the figure, a signal transmission arrow 4 refers to the transmission trace of the signal after the repair line is used to repair the data line, but the repair ability of the repair method is limited. First, the method can only repair one or two data lines, and cannot repair the scan line (gate line). In addition, the length of the repair line is inevitably longer due to the peripheral layout. Thus, when it is bridged to the disconnection trace, its signal in the longer signal transmission gets attenuated. In order to solve the attenuation problem, it is necessary to add the operation amplification function to the corresponding printed circuit board (PCB) 2 corresponding to the repair line 1. In this way, this not only increases the manufacturing cost of the product, but also has the limited repair capacity, and it is difficult to satisfy the existing requirements. In order to solve this problem, the applicant has proposed the following improved scheme.

Figure 2:
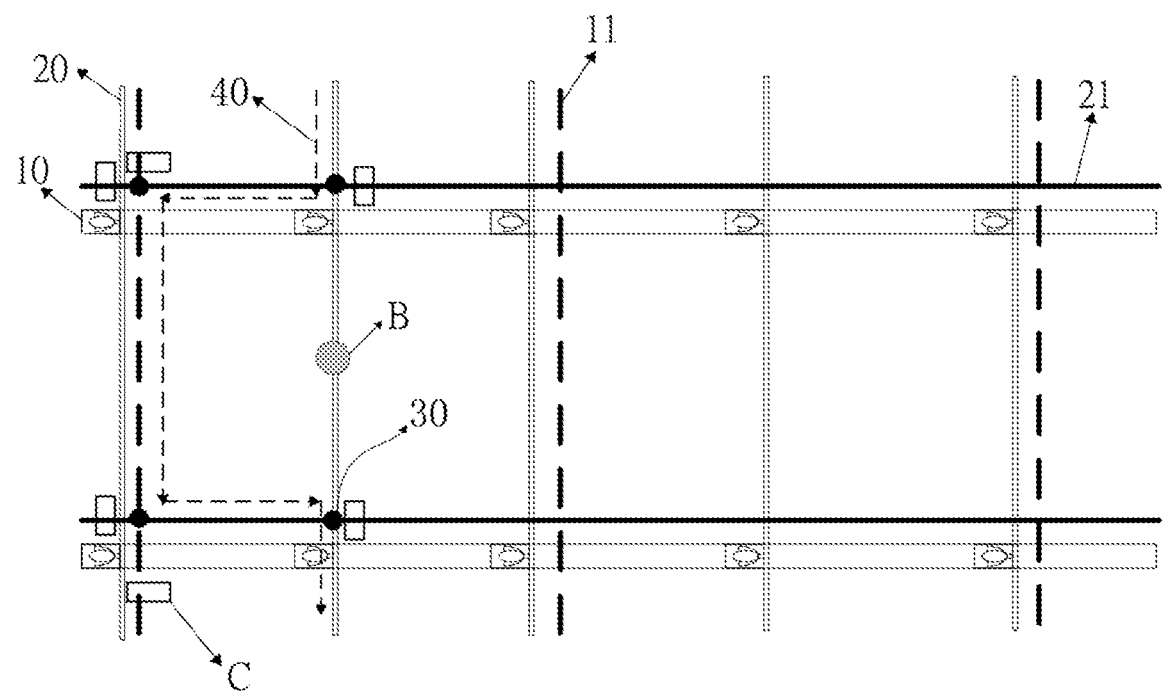
FIG. 2 is a schematic view showing data line disconnection repair of a display panel of this disclosure.
Figure 3:
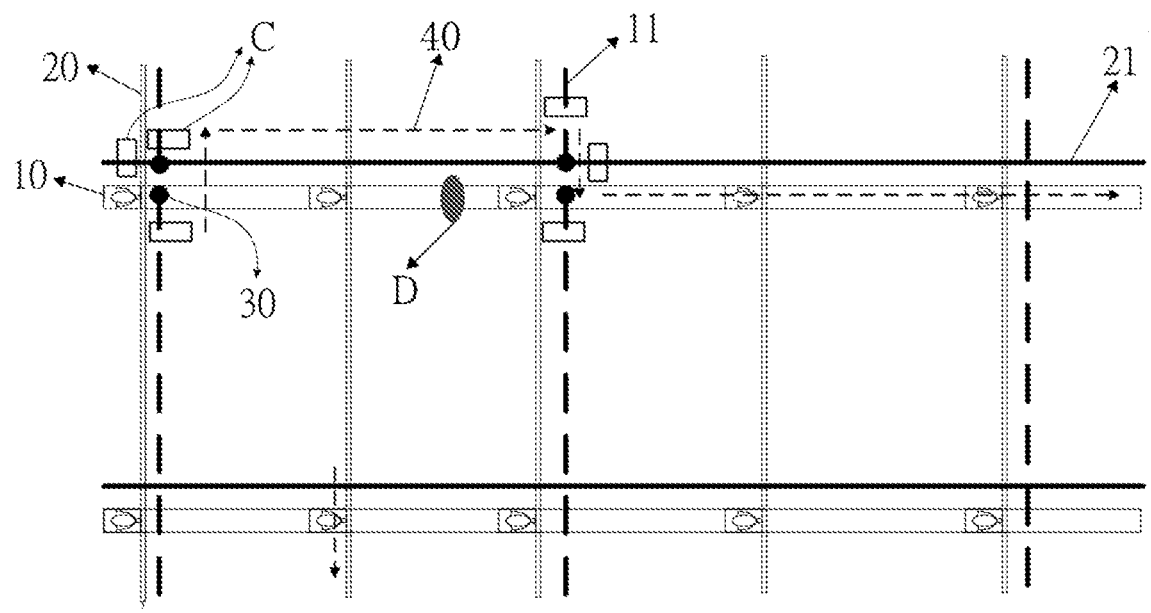
FIG. 3 is a schematic view showing scan line disconnection repair of the display panel of this disclosure.
Figure 4:
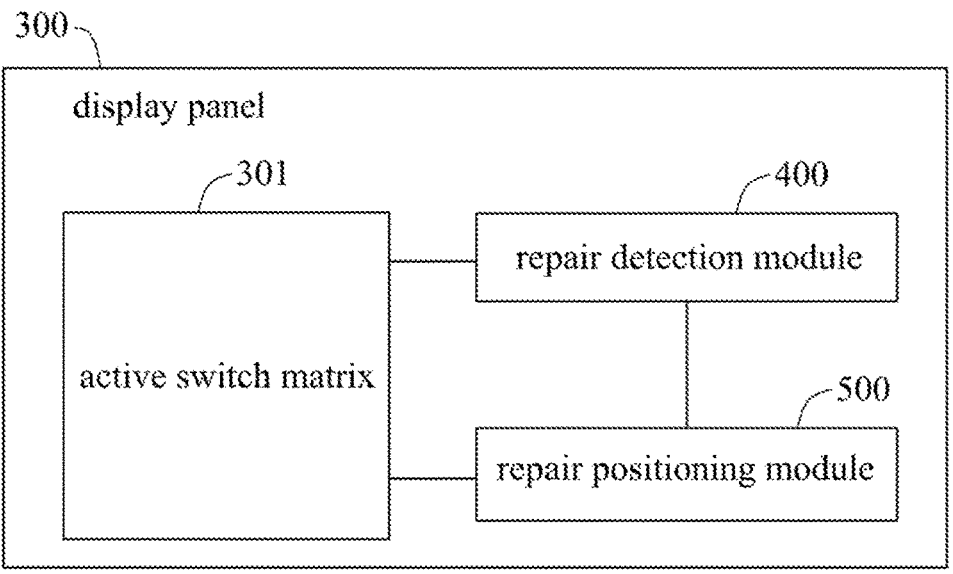
FIG. 4 is a schematic view showing a display panel of the invention.

FIG. 2 is a schematic view showing data line disconnection repair of a display panel of this disclosure, FIG. 3 is a schematic view showing scan line disconnection repair of the display panel of this disclosure, and FIG. 4 is a schematic view showing a display panel of the invention. Referring to FIGS. 2, 3 and 4 and compared with FIG. 1, it is obtained that this disclosure discloses a display panel 100, which includes: a first substrate including color resistor units; a second substrate disposed opposite to the first substrate; an active switch matrix 300 disposed on the first substrate or the second substrate; wherein the active switch matrix 300 includes multiple scan lines 10 and multiple data lines 20; a first repair line 11 is disposed on one side of at least one of the scan lines, and a second repair line is disposed one side of at least one of the data lines 20.

The first repair line 11 is correspondingly disposed beside the scan line 10, and the second repair line 21 is correspondingly disposed beside the data line 20. When the scan line 10 or the data line 20 is opened or broken, the first repair line 11 or the second repair line 21 is bridged to the trace of the corresponding opened scan line 10 or data line 20.

For the display panel, the applicant had used a repair line running on a periphery of the substrate to perform the repair method. However, the method can only repair one or two data lines, and cannot repair the scan line (gate line). In addition, because the layout is longer, it is inevitably necessary to add the operation amplification function to the corresponding PCB, and increase the manufacturing costs.

In this disclosure, the first repair line and the second repair line are correspondingly disposed beside the scan line and the data line. In this way, not only the data line but also the scan line can be repaired. In addition, because there may be provided with two first repair lines and two second repair lines, the repair number is better enhanced in this way. Furthermore, because the lengths of the first repair line and the second repair line are equal to those of the corresponding scan line and data line, this disclosure is free from the problems that the attenuation is caused by the too-long layout and that the operation amplification is needed.

In the figure, when the opened point B of the data line or the opened point D of the scan line is found, the first repair line 11 or the second repair line 21 is bonded and bridged through a bonding point 30 to complete the repair work of the trace.

Optionally, the first repair lines 11 correspond to the scan lines 10 in a one-to-one manner, the second repair lines 21 correspond to the data lines 20 in a one-to-one manner in this embodiment. In this embodiment, the repair lines are disposed in correspondence with the scan lines and the data lines in a one-to-one manner, and this can be achieved by only modifying the design to add the traces corresponding to the repair lines in the mask processing. In this way, even if there are multiple traces broken or disconnected, bonding and bridging the reserved metal repair lines can to achieve the purpose of repairing the disconnection.

Optionally, in this embodiment, a ratio of the number of the first repair lines 11 to the number of the scan lines 10 is greater than or equal to one half, and the first repair lines 21 are disposed in an equidistant manner. One of the second repair lines 21 is correspondingly disposed beside each of the data lines 20. In this embodiment, the first repair lines are disposed in correspondence with the scan lines in a one-to-two manner, and the second repair lines are disposed in correspondence with the data lines in a one-to-one manner.

This can be achieved by only modifying the design to add the traces corresponding to the repair lines in the mask processing. In this way, even if there are multiple traces broken or disconnected, bonding and bridging the reserved metal repair lines can to achieve the purpose of repairing the disconnection.

Optionally, one of the first repair lines 11 is correspondingly disposed beside each of the scan lines 10, a ratio of the number of the second repair lines 21 to the number of the data lines 20 is greater than or equal to one half, and the second repair lines 21 are disposed in an equidistant manner in this embodiment.

In this embodiment, the first repair lines 11 are disposed in correspondence with the scan lines 10 in a one-to-two manner, and the second repair lines 21 are disposed in correspondence with the data lines 20 in a one-to-one manner. This can be achieved by only modifying the design to add the traces corresponding to the repair lines in the mask processing. In this way, even if there are multiple traces broken or disconnected, bonding and bridging the reserved metal repair lines can to achieve the purpose of repairing the disconnection.

Optionally, the first repair lines 11 are disposed in correspondence with the scan lines 10 in one layer or different layers.

When a repair process is required, the first repair line 11 is bridged to the trace of the to-be-repaired scan line 10. In this embodiment, the first repair line and the scan line correspond to each other and are disposed nearby, and may be disposed in correspondence with each other in the same layer or different layers, and are disconnected from each other in the normal condition. When necessary, the repair line is connected to the disconnection trace to achieve the repair purpose by way of solder point bonding or through-hole joint bonding.

Optionally, the second repair lines 21 are disposed in correspondence with the data lines 20 in one layer or different layers.

When a repair process is required, the second repair line 21 is bridged to the trace of the to-be-repaired data line 20. In this embodiment, the second repair line and the data line correspond to each other and are disposed nearby, and may be disposed in correspondence with each other in the same layer or different layers, and are disconnected from each other in the normal condition. When necessary, the repair line is connected to the disconnection trace to achieve the repair purpose by way of solder point bonding or through-hole joint bonding.

In addition, when the disconnection of the scan line 10 or the data line 20 needs to be co-repaired through the first repair line 11 and the second repair line 21 crossing each other, the first repair line and the second repair line are bridged through the bonding method of the bonding point 30.

In this embodiment, when the first repair line 11 and the second repair line 21 are provided, it is possible to consider that the disconnection may be present, and only a first repair line or a second repair line alone cannot complete the repair situation. For example, when a certain data line cannot be repaired according to the corresponding second repair line, the nearby first repair line or a part of the nearby first repair line may be used to complete the purpose of repairing the disconnection.

In this embodiment, the first repair line 11 and the second repair line 21 pertain to a portion of the traces that needs to be repaired, the useful traces are isolated from the useless traces by way of cutting off (i.e., cutting off the process point C), and it is disconnected from a portion of the repair traces forming the electroconductive pathways.

In this embodiment, when the first repair line 11 and the second repair line 21 are provided, it is possible to consider that the disconnection may be present, and only a first repair line or a second repair line alone cannot complete the repair situation. For example, when a certain data line cannot be repaired according to the corresponding second repair line, the nearby first repair line or a part of the nearby first repair line may be used to complete the purpose of repairing the disconnection. If a portion of the repair line that is not used is not disconnected, other problems, such as short circuit, may occur. Thus, in this embodiment, if the repair purpose only needs a portion of the first repair line or the second repair line, then the unused portion is disconnected from the portion of the trace used to repair.

Bonding achieves the bridging, and the first repair line 11 or the second repair line 21 is bridged to the trace of the opened scan line 10 or the trace of the data line 20 through the bonding method of the bonding point 30. In this embodiment, the first repair line and the second repair line can be bridged to the short-circuited scan line or data line through the bonding method of the bonding point.

Optionally, the active switch matrix is disposed on the second substrate. Of course, the active switch matrix can be disposed on the first substrate. In this case, the color resistor units are formed on the active switch matrix.

Optionally, the display panel further comprises a repair detection module 400 coupled to the active switch matrix 300 for detecting trace conditions of the scan lines 10 or the data lines 20, and a repair positioning module 500 coupled to the active switch matrix and the repair detection module 400 for positioning a specific position of the scan line 10 or the data line 20 with a trace problem.

In the above-mentioned embodiment, the display panel includes a liquid crystal panel, an organic light-emitting diode (OLED) panel, a quantum dot light emitting diode (QLED) panel, a plasma panel, a flat panel, a curved panel and the like. For the liquid crystal display panel, a liquid crystal display layer is disposed between the first substrate and the second substrate. Controlling the liquid crystal molecular deflection can control the light transmittance to form a variety of display images in combination with the color filter.

Figure 5:
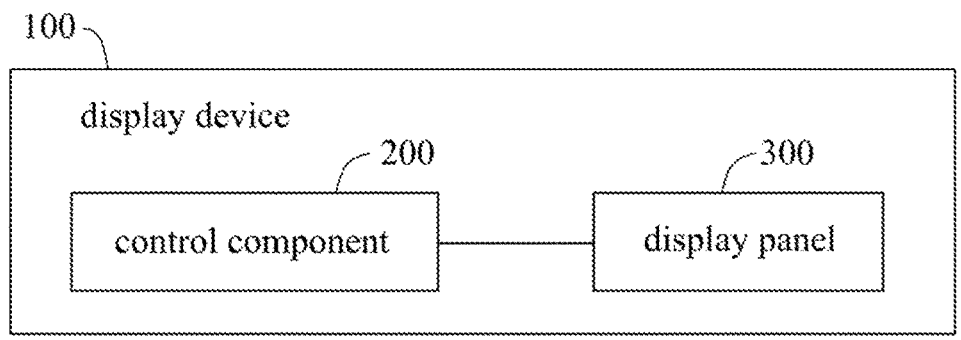
FIG. 5 is a schematic view showing a display device of this disclosure.

FIG. 5 is a schematic view showing a display device of this disclosure. The display device 100 includes a control component 200 and the display panel 300 as disclosed in any one of this disclosure.

In the display device of the disclosure, the repair line runs on a periphery of the substrate to perform the repair method. However, the method can only repair one or two data lines, and cannot repair the scan line (gate line). In addition, because the layout is longer, it is inevitably necessary to add the operation amplification function to the corresponding PCB, and increase the manufacturing costs. In this disclosure, the first repair line and the second repair line are correspondingly disposed beside the scan line and the data line. In this way, not only the data line but also the scan line can be repaired. In addition, because there may be provided with two first repair lines and two second repair lines, the repair number is better enhanced in this way. Furthermore, because the lengths of the first repair line and the second repair line are equal to those of the corresponding scan line and data line, this disclosure is free from the problems that the attenuation is caused by the too-long layout and that the operation amplification is needed.

The display panel is described in detail as an example hereinabove. It is to be described that the above-mentioned description of the structure of the display panel is also applicable to the display device of the embodiment of this disclosure. When the display device of the embodiment of this disclosure is a liquid crystal display, the liquid crystal display includes a backlight module, and the backlight module can be used as a light source for supplying the light with sufficient brightness and uniform distribution. The backlight module of this embodiment can be either a front lighting type or a backlight type. It is to be described that the backlight module of this embodiment is not limited thereto.

Figure 6:
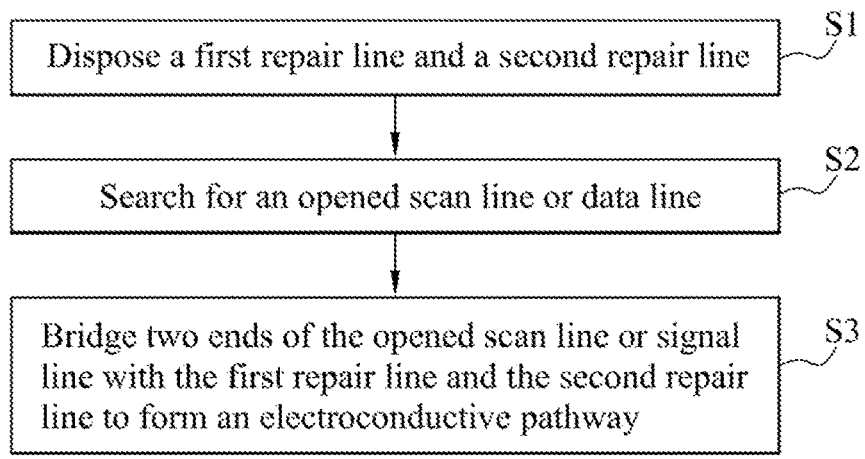
FIG. 6 is a flow chart showing a method of repairing a display panel of this disclosure.

The present disclosure also provides a method of repairing a display panel. Referring to FIG. 6 in view of FIGS. 1-5, the display panel 100 comprises a first substrate and a second substrate disposed opposite to the first substrate. The first substrate comprises color resistor units, and an active switch matrix 300 is disposed on the first substrate or the second substrate. The active switch matrix 300 comprises scan lines and data lines. The method comprises steps of: correspondingly disposing a first repair line beside the scan line, and correspondingly disposing a second repair line beside the data line (S1); looking for an opened scan line or an opened data line (S2); and respectively bridging two ends of the opened scan line or the opened data line with the first repair line and the second repair line to form an electroconductive pathway (S3).

In this embodiment, analysis is performed according to the found opened scan line or data line to determine whether a first repair line or a second repair line needs to be used for repair, or two repair lines are needed for repair. After the analysis, the repair lines are bridged to form an electroconductive pathway to repair the open-circuit problem.

Optionally, the step of respectively bridging the two ends of the opened scan line or the opened data line with the first repair line and the second repair line to form the electroconductive pathway comprises: bridging the scan line or the data line with the corresponding first repair line and second repair line by way of laser bonding. In this embodiment, the bridging can be achieved by bonding methods, such as a laser bonding lamp and the like. In addition, the first repair line and the second repair line adopted as the repair routes are not incorporated into portions of the electroconductive pathways, and are isolated from the portions of the electroconductive pathways by way of disconnecting to avoid the possibility of short-circuited, open-circuited and other problems.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A display panel, comprising:
   a first substrate comprising color resistor units;
   a second substrate disposed opposite to the first substrate; and
   an active switch matrix disposed on the first substrate or the second substrate;
   wherein the active switch matrix comprises scan lines and data lines, a first repair line is disposed on one side of at least one of the scan lines, and a second repair line is disposed on one side of at least one of the data lines,
   wherein the first repair lines are disposed in correspondence with the scan lines in different layers, and the second repair lines are disposed in correspondence with the data lines in different layers,
   wherein a ratio of the number of the first repair lines to the number of the scan lines is smaller than one and greater than or equal to one half, the first repair lines are disposed in an equidistant manner,
   wherein a ratio of the number of the second repair lines to the number of the data lines is smaller than one and greater than or equal to one half, the second repair lines are disposed in an equidistant manner.

2. The display panel according to claim 1, wherein the active switch matrix is disposed on the second substrate.

3. The display panel according to claim 1, wherein the active switch matrix is disposed on the first substrate, and the color resistor units are formed on the active switch matrix.

4. The display panel according to claim 1, wherein the first repair lines and the second repair lines are disposed in one layer or different layers.

5. The display panel according to claim 1, further comprising:
   a repair detection module coupled to the active switch matrix and detecting trace conditions of the scan lines or the data lines; and
   a repair positioning module coupled to the active switch matrix and the repair detection module, and positioning a specific position of the scan line or the data line with a trace problem.

6. A method of repairing a display panel, the display panel comprising a first substrate and a second substrate disposed opposite to the first substrate, the first substrate comprising color resistor units, an active switch matrix disposed on the first substrate or the second substrate, the active switch matrix comprising scan lines and data lines, and the method comprising steps of:
   correspondingly disposing a first repair line on one side of at least one of the scan lines, and correspondingly disposing a second repair line on one side of at least one of the data lines;
   looking for an opened scan line or an opened data line; and
respectively bridging two ends of the opened scan line or the opened data line with the first repair line and the second repair line to form an electroconductive pathway,
   wherein the first repair lines are disposed in correspondence with the scan lines in different layers, and the second repair lines are disposed in correspondence with the data lines in different layers, and
   wherein a ratio of the number of the first repair lines to the number of the scan lines is smaller than one and greater than or equal to one half, the first repair lines are disposed in an equidistant manner,
   wherein a ratio of the number of the second repair lines to the number of the data lines is smaller than one and greater than or equal to one half, the second repair lines are disposed in an equidistant manner.

7. The method according to claim 6, wherein the step of respectively bridging the two ends of the opened scan line or the opened data line with the first repair line and the second repair line to form the electroconductive pathway comprises: bridging the scan line or the data line with the corresponding first repair line and second repair line by way of laser bonding.

8. The method according to claim 6, wherein the active switch matrix is disposed on the second substrate.

9. The method according to claim 6, wherein the active switch matrix is disposed on the first substrate, and the color resistor units are formed on the active switch matrix.

10. The method according to claim 6, wherein the display panel further comprises:
- a repair detection module configured to detect trace conditions of the scan lines or the data lines; and
- a repair positioning module configured to position a specific position of the scan line or the data line with a trace problem.

* * * * *